United States Patent [19]

Stack

[11] Patent Number: 5,146,098
[45] Date of Patent: Sep. 8, 1992

[54] ION BEAM CONTAMINATION SENSOR

[75] Inventor: Andrew P. Stack, San Jose, Calif.

[73] Assignee: VLSI Technology, Inc., San Jose, Calif.

[21] Appl. No.: 681,807

[22] Filed: Apr. 5, 1991

[51] Int. Cl.$^5$ .......................................... H01J 37/244
[52] U.S. Cl. .................. 250/492.2; 250/397; 250/492.3
[58] Field of Search .............. 250/492.21, 397, 378, 250/492.3, 492.23, 309

[56] References Cited

U.S. PATENT DOCUMENTS

| | | | |
|---|---|---|---|
| 4,874,947 | 10/1989 | Ward et al. | 250/309 |
| 4,988,872 | 1/1991 | Nagatsuka et al. | 250/310 |
| 5,047,648 | 9/1991 | Fishkin et al. | 250/492.3 |

FOREIGN PATENT DOCUMENTS 56-01531  9/1981  Japan ........................ 250/492.21
57-88661  2/1982  Japan ........................ 250/492.21

Primary Examiner—Jack I. Berman
Assistant Examiner—James E. Beyer
Attorney, Agent, or Firm—Burns, Doane, Swecker & Mathis

[57] ABSTRACT

The present invention is directed to systems and methods for accurately detecting the presence of particles, such as contaminants and residual gases in an end station during wafer processing. In a preferred embodiment, the type and amount of each contaminant can be determined by spectrally decomposing in situ light generated during wafer processing to detect characteristics of potential contaminants and/or residual gases. Characteristics which can be used to identify the presence of contaminants include abnormal wavelength, frequency and/or intensity of energy present during wafer processing.

21 Claims, 3 Drawing Sheets

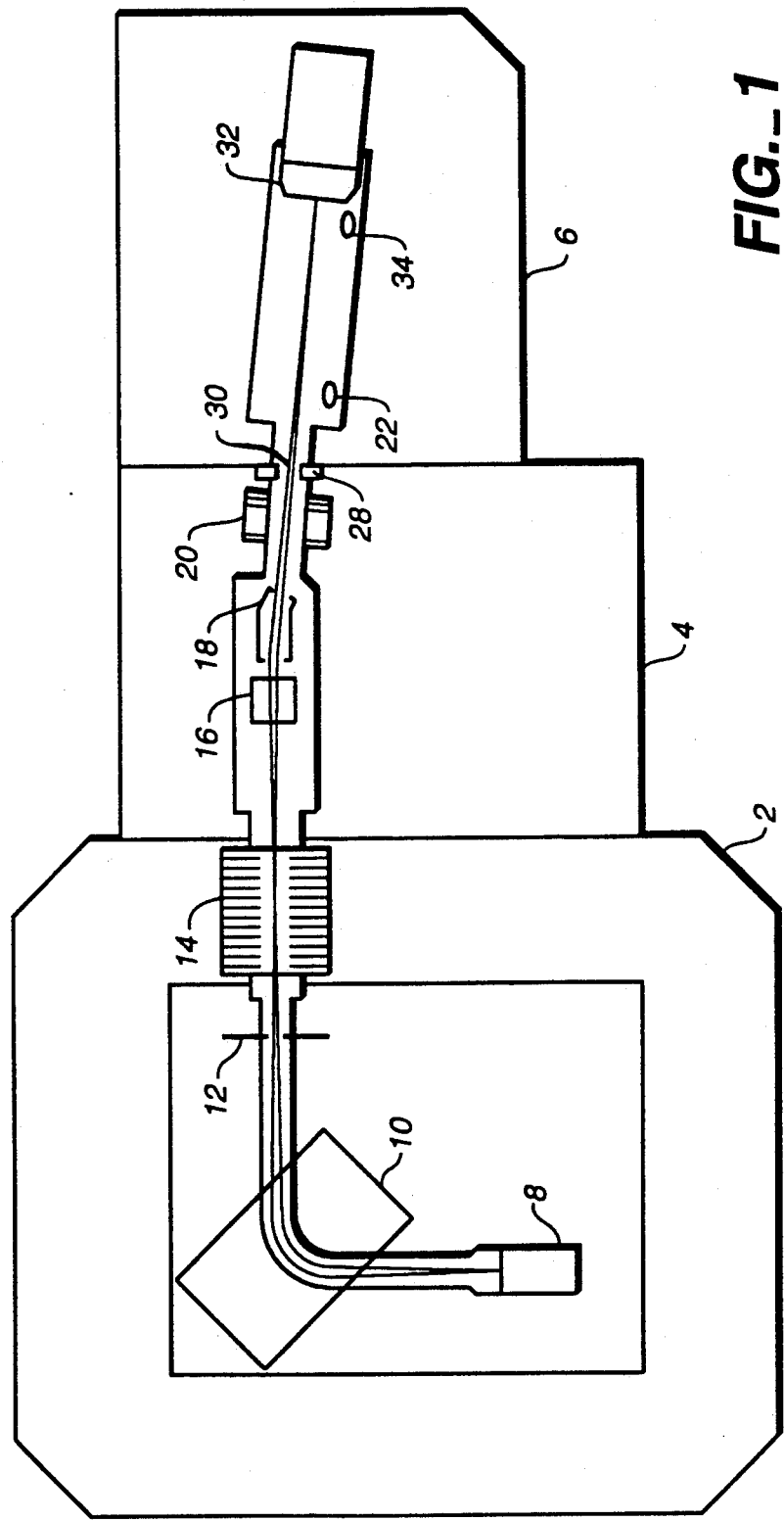
FIG._1

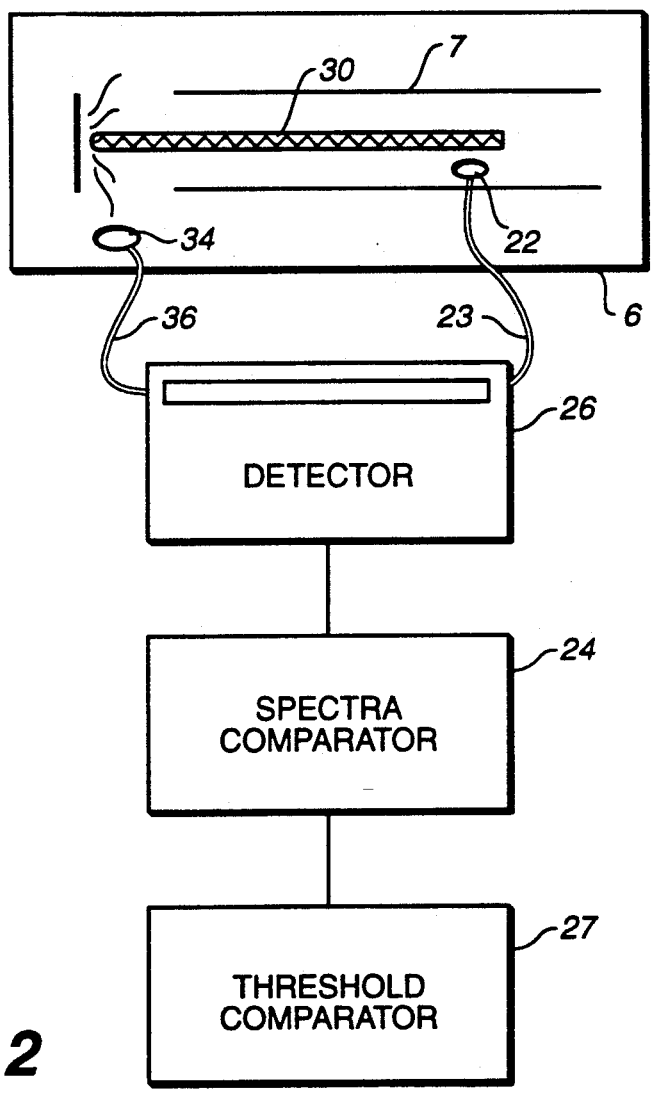
FIG._2

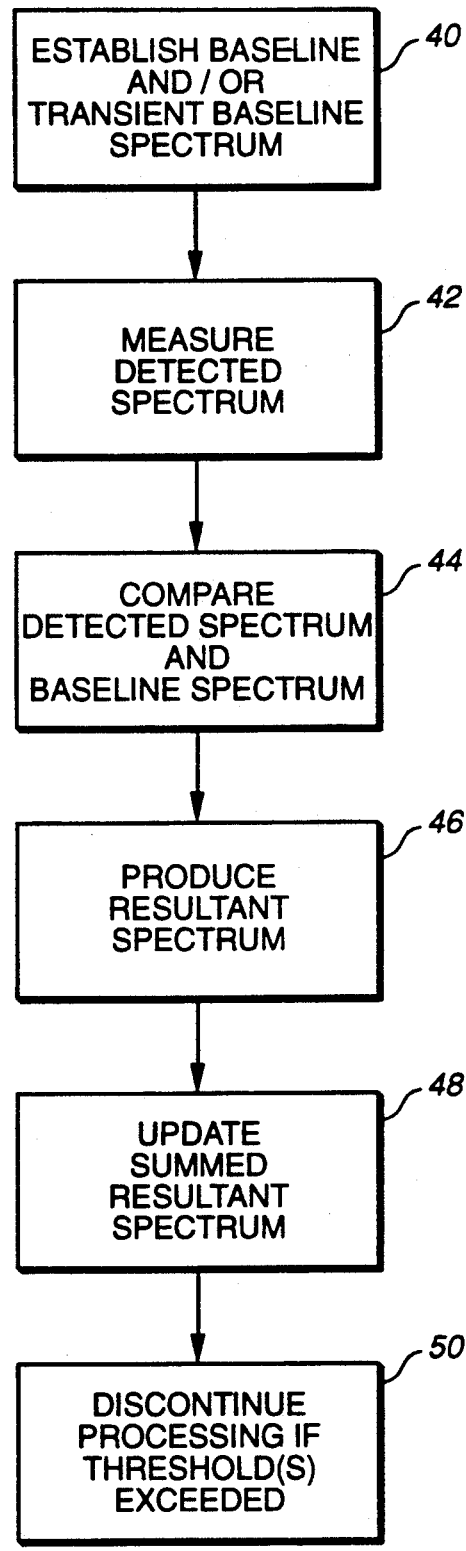
FIG._3

ION BEAM CONTAMINATION SENSOR

BACKGROUND OF THE INVENTION

1. Field of the Invention

The present invention relates generally to the fabrication of semiconductors, and more particularly, to the determination of in situ particle contamination levels and identities during ion implantation.

2. State of the Art

Ion implantation devices, or ion implanters, are known machines used in the fabrication of semiconductor chips. These devices are typically used to change the characteristics of a silicon wafer by inserting, or implanting, a thin layer of atoms into the wafer. This process is often referred to as doping, with the implanted atoms being referred to as the dopant.

Typically, doping is achieved by accelerating the dopant atoms to approximate speeds of one million miles per hour and bombarding the wafer surface with the accelerated ions. By regulating the speed of the dopant atoms, the number of implanted atoms and their depth of penetration into the silicon wafer can be accurately regulated. Common dopants include boron, phosphorous and arsenic.

One known ion implanter is the Varian Ion Implanter. This device performs four basic steps to effect ion implantation. First, the ion implanter converts gas molecules into an ion beam. The device then selectively redirects specified ions in the beam so that they may be used for implant. Afterward, the specified ions are accelerated to a speed commensurate with desired implantation depth. Finally, the ion implanter controls the total number of ions implanted (i.e., the "dose").

A generalized block diagram of a typical ion implanter is shown in FIG. 1 to include three basic components: a source 2, a beam line 4, and an end station 6, all of which are vacuum pumped. The source 2 receives gas via a dopant feed 8. Ions are extracted out of the source using a potential difference of, for example, 25 keV to attract positively charged ions toward a mass analyzer 10. The mass analyzer uses magnetic forces to select ions having a desired mass and charge from undesired ions.

More particularly, the mass analyzer typically causes all ions in the beam to be deflected by an amount dependent upon their mass and charge. Desired ions having a specified mass and charge are deflected by an amount which enables them to pass through an aperture 12 located on a downstream side of the mass analyzer. An ion beam containing desired implantation ions is thus produced at a output of the aperture.

As mentioned previously, implanting of the selected ions is controlled by accelerating the ions to a desired speed. In the FIG. 1 implanter, ion speed is controlled by subjecting the ion beam to a high voltage coil 14. The high voltage coil 14 typically generates approximately 175 keV of energy to accelerate the ions. This value is adjusted up to, for example, 200 keV to increase ion speed and implant energy, and is adjusted downward to decrease ion speed.

The beam of accelerating ions leaving the source 8 is then focused in the beam line 4 via use of quadrapole lenses 16 and 18. Each of the quadrapole lenses surrounds the ion beam with, for example, two opposing positive lenses and two opposing negative lenses such that the ion beam passes between all four lenses. In the quadrapole lens 16, the opposing negative lenses are oriented vertically to permit focusing of the positively charged ion beam in a vertical direction. In the quadrapole lens 18, the opposing negative lenses are oriented horizontally to permit focusing of the ion beam in a horizontal direction. By changing the relative positive and negative potential of a given quadrapole lens, the orientation of the ion beam can thus be regulated.

The focused ion beam is then moved up and down and back and forth in a scanning motion via a charged scanner 20. Ions output from the scanner 20 are directed toward a silicon wafer located on a wafer plate 32 in the end station 6. Once implanted in a selected area of a wafer, the ions are converted into atoms which form a thin layer in the wafer.

While implanters of the above-described type are well known and widely used, they often result in the production of wafers containing contaminates Such contamination is, for example, the result of macro-contaminants present on the wafer prior to processing.

Macro-contaminants are also produced when gas deposits which have built up on walls of the wafer processing chamber flake off into the vicinity of the wafer. Further, differentially pumped vacuum seals used to seal off the stages of the implanter during processing slide against portions of the chamber, with attendant friction resulting in the release of particulate contaminates. During venting as well as during subsequent repumping of the chamber to processing pressure, turbulence and/or high energy states are created which can further accelerate and disperse particles.

Similar contaminates are introduced as a result of any friction created in the chamber. For example, implanters which use a rotary drive to turn a plate supporting several (e.g., 10) wafers in the end station will produce friction and release particle contaminants from ferromagnetic fluids used to seal the rotary drive. Further, if a wafer being processed is broken, contaminants are released.

In the past, efforts have been made to detect contaminants which may result in the production of defective wafers. For example, laser particle detectors have been provided for this purpose. Laser particle detectors sense contaminants by scanning a laser beam in an area of the end station where the wafer is located. Light reflected from particles which intercept the scanning laser beam are detected and used to increment a particle counter.

Known contaminant detectors such as the laser particle detector suffer from several disadvantages. For example, a key disadvantage of these detectors is that a particle must intersect the laser beam to be detected. Further, these detectors can not be placed near the wafer location in an implanter, but rather are located in a roughing line of the end station, approximately 15 inches away from the wafer. This separation distance creates additional inaccuracies in the measurement, as contaminants close to the wafer surface are often missed.

In addition, laser particle detectors are operated only during the pump and vent cycles of the end station, thus further reducing the detection accuracy. These detectors do not measure particles during actual implantation primarily because they rely on the pump and vent cycle to create turbulence in the end station.

Accordingly, there is a need to provide an accurate system and method for detecting the existence of contaminants present in an end station during wafer processing.

SUMMARY OF THE INVENTION

The present invention is directed to systems and methods for accurately detecting the presence of particles such as contaminants and residual gases in an end station during wafer processing. In a preferred embodiment, the type and amount of each contaminant can be determined by spectrally decomposing in situ light generated during wafer processing to detect characteristics of potential contaminants and/or residual gases. Characteristics which can be used to identify the presence of contaminants include abnormal wavelength, frequency and/or intensity of energy present during wafer processing.

More particularly, the invention relates to methods and apparatus for detecting particles present during ion beam implantation of a wafer by sensing energy in a vicinity of the wafer surface; spectrally analyzing the sensed energy to provide a detected spectrum; and comparing the detected spectrum with a predetermined baseline spectrum representing characteristics of an ion beam used for wafer implantation. As a result of the comparison, a resultant spectrum is produced for identifying contaminants and residual gases present at or near the wafer surface during processing.

BRIEF DESCRIPTION OF THE DRAWINGS

Other objects and advantages of the present invention will become apparent from the following detailed description when read in conjunction with the accompanying drawings wherein like elements have been designated with like numerals and wherein:

FIG. 1 shows a general block diagram of a known ion implantation device which, in accordance with a preferred embodiment of the invention, has been retrofit with an exemplary detector device designed in accordance with the present invention:

FIG. 2 is an exemplary preferred embodiment of the FIG. 1 detector device; and

FIG. 3 is an exemplary flow chart for use in implementing a preferred embodiment.

DETAILED DESCRIPTION OF THE PREFERRED EMBODIMENTS

An exemplary preferred embodiment of the invention will now be described in connection with FIGS. 1 and 2. In FIG. 2, a detection device is shown which can, for example, be used in connection with the FIG. 1 end station 6.

The FIG. 2 detection device includes a first lens 22 connected via a first optical cable 23 to a photo-detector data acquisition unit 26. The first lens 22 is located in a roughing line 7, in the vicinity of the ion beam a it enters the end station. For example, the first lens 22 can be situated in the FIG. 1 implanter next to a Faraday flag 28, which is a conventional valve used to control access of the end station 6 to the ion beam 30 output from the beam line 4. As shown in FIG. 1, the flag 28 is in its open position to allow the ion beam 30 to contact wafers stationarily situated on a wafer plate 32.

A second lens 34 is situated in the vicinity of the wafer plate 32. Unlike the laser particle generator described above, the lenses 22 and 34 do not require that contaminants intersect a laser beam path in order to be detected. Accordingly, proximity of these lenses to the ion beam and the wafer surface, respectively, is not critical, and can in each case be one to several (e.g., 15) inches. However, it is desirable to separate the lenses to the greatest extent possible given the structure of the end station so that the energy, such as light, detected by lens 22 only identifies characteristics of the ion beam while energy detected by lens 34 identifies energy emissions near the wafer surface.

The second lens 34 is also connected with the photo-detector data acquisition unit 26 via a second fiber optic cable 36. The lens 34 and fiber optic cable 36 are identical to the lens 22 and fiber optic cable 23. Light detected by the lenses 22 and 34 is received by a photo-detector array includes in the photo-detector data acquisition unit, wherein it is broken down into its spectral wavelength components. In an alternate embodiment, the energy received can be decomposed into its frequency components and used in place of, or in conjunction with the wavelength spectra.

The optical analysis of light using a spectral analyzer is well known. For example, such analyzers are used to spectrally decompose light sensed in ion etching devices for the purpose of detecting an etch endpoint. Therefore, for purposes of the present discussion, the decomposition of light detected by the lenses 22 and 34 into its spectral components need not be described in detail.

In accordance with a preferred embodiment, light received via lens 22 is used to establish a baseline characteristic, or "fingerprint", of the ion beam 30. More particularly, light received by the photo-detector data acquisition unit 26 via lens 22 monitors the intensities of wavelength components included in the energy emitted by the ion beam 30.

Alternately, the unit 26 can include means for detecting frequency characteristics of energy received via the detectors 22 and 34 either in place of, or in conjunction with the wavelength characteristics. The frequency components, can, for example, be indirectly determined from the detected wavelength components, or can be directly determined by using one or more filters to identify the intensity of each desired frequency component in the energy detected.

Light received by the photo-detector data acquisition unit via the lens 34 is used to monitor the intensities of wavelength (and/or frequency) components included in energy emitted as the ion beam 30 contacts the wafer surface. Because the lens 34 is in the vicinity of the wafer surface, it will detect the ion beam characteristics as well as emissions from the wafer surface (e.g., wavelengths due to gases liberated from the wafer surface during the ion implantation). Further, the lens 34 will detect the presence of contaminants near the wafer surface, which contaminants will typically vaporize in the ion beam and produce light emissions due to the high energy present in the end station.

The spectrum of wavelength and/or frequency characteristics detected in response to light received by the lens 22 (i.e., the ion beam "fingerprint") is compared with the spectrum of wavelength and/or frequency characteristics detected in response to light received by the lens 34 (i.e., "fingerprint" at wafer surface). This comparison is continuously performed via a known spectra comparator 24 on a real time basis during the ion implantation process.

With each comparison, wavelength characteristics of the ion beam 30, as sensed by the lens 22, are subtracted from the wavelength characteristics of the ion beam in the vicinity of the wafer, as sensed by the lens 34. Thus, with each comparison, a resultant wavelength or frequency spectrum is produced.

Each resultant spectrum is composed of only those wavelengths or frequencies due to reactions of the ion beam with the wafer surface and/or due to contaminants present near the wafer surface at the time of the comparison. The existence of detected light intensities at specific wavelength components can then be easily correlated to the presence of specific contaminants.

The wavelength and frequency characteristics of the ion beam being used for wafer processing at a given energy level are typically known, or can be determined in advance of the processing. Similarly, wavelength and frequency characteristics of a wafer substrate being processed by a given ion beam species at a given energy level can be determined in advance. Accordingly, the detection of wavelength or frequency intensities in the resultant wavelength spectrum which are not associated with either the ion beam or the wafer reaction to the ion beam can be correlated to the presence of a contaminant.

The intensity of each resultant component at a given point in time will typically correspond to the amount of the contaminant present. The wavelength or frequency intensities determined to be associated with the presence of each contaminant can be continuously summed in the spectral comparator 24 to produce a summed resultant spectrum. The summed resultant spectrum thus constitutes a continuously updated file of the total amount of contamination. Further, by performing a statistical analysis in advance, defect causing threshold points for specified contaminants can be experimentally established and input to a threshold comparator 27.

For example, by detecting the amount of a given contaminant which resulted in fabrication of a defective wafer during processing of several wafer samples, a suitable threshold or thresholds can be identified. Thus the processing of subsequent wafers can be discontinued once a threshold has been exceeded for any one or more of the summed resultant spectrum components.

It will be appreciated that elements 24, 26 and 27 of FIG. 2 can be embodied as a single control unit. Process steps reflecting an exemplary, illustrative operation of such a unit are shown in FIG. 3.

In FIG. 3, energy received via, for example, lens 22 is used to establish a baseline spectrum in step 40. As will be described below, a transient baseline spectrum can also be established. A detected spectrum for a wafer currently being processed is produced in step 42.

The baseline spectrum and detected spectrum are differentially compared in step 44, and used to produce a resultant spectrum in step 46. Each resultant spectrum produced during processing of a given wafer is added in step 48 to produce a summed resultant spectrum. Spectral components of the summed resultant spectrum ar subsequently compared with predetermined threshold components in step 50. To avoid fabrication of defective wafers, wafer processing is discontinued if one or more of the threshold components are exceeded.

Contaminants whose wavelength characteristics can be readily recognized include, for example, contaminant particles due to the frictional release of particles associated with vacuum seals in the end station. While such contaminants are often readily recognizable, other contaminants are much more difficult to detect. For example, certain organic contaminants present in the end station may have characteristic wavelengths similar to those of gases being liberated from the wafer surface during implantation.

More particularly, surfaces of a wafer often are coated with an organic photoresist material. Accordingly, during ion implantation, some hydrogen and/or carbon wavelength components may appear in the resultant wavelength spectrum, rendering detection of contaminants containing hydrogen and/or carbon difficult.

To avoid such confusion, a transient baseline characteristic for the ion implantation to be effected can be obtained by measuring the wavelength or frequency characteristics present during the ion implantation of several wafer samples. As referenced herein, a transient baseline characteristic represents wavelength or frequency components present due to the normal processing of the wafer samples.

The wavelength spectrums obtained during the course of processing the sample wafers are compared to identify commonly present characteristics consistently present at the same point in time during processing of all of the wafer samples. These consistently present characteristics, with their associated wavelength or frequency intensities represent the transient baseline characteristic of the wafer process. The components associated with the transient baseline characteristic at any specified time during the wafer processing can thus be ignored as contaminants.

Accordingly, upon subsequent processing of wafers, a real time determination can be made of in situ particles and their associated contamination levels by further comparing the detected spectrum obtained via the lens 34 with the spectrum of the transient baseline characteristic. Upon a determination that the contamination level of any one or more of these particles has exceeded a predetermined threshold, processing of the wafer or wafers can be discontinued. As mentioned previously, such a threshold or thresholds can be statistically determined by experimentation with sample wafers.

In an alternate preferred embodiment, the first lens 22 can be eliminated, and the experimentally determined transient baseline described above used to characterize the ion beam as well. During setup, a transient baseline determination must be provided for each different species of ion beam, for each different operating energy level, and for each different beam current. The transient baseline spectrum associated with the currently used species, energy level and ion beam current is then selected and compared with the detected spectrum obtained via the single lens 34.

Further, the inventive features can be employed in any ion implantation device. The foregoing description regarding use of exemplary embodiments in connection with the Varian Ion Implanter is therefore provided for purposes of illustration only. For example, the invention can be used in similar fashion with the known NOVA Ion Implanter as well.

During processing, it may be desirable to detect the compositions of residual gases emanating from the wafer surface. Accordingly, detection systems described above can be used to measure the intensities of wavelengths or frequencies associated with the residual gases. As described above, deviations in the output spectrum produced in response to data received via the lens 34 relative to an experimentally determined transient baseline can be used to monitor the implantation process.

It will be appreciated that the present invention is not limited to the illustrative embodiments described above, but can be embodied in other specific forms without departing from the spirit or essential characteristics thereof. The scope of the invention is defined by the appended claims, and all changes that come within the meaning and equivalents thereof are intended to be embraced therein.

What is claimed:

1. Apparatus for detecting particles present during ion beam implantation of a wafer comprising:
   first means for sensing energy in a vicinity of the wafer surface;
   means for spectrally analyzing said sensed energy to provide a detected spectrum; and
   means for comparing said detected spectrum with a predetermined baseline spectrum representing characteristics of an ion beam used for wafer implantation, said comparison producing a resultant spectrum for identifying contaminants and residual gases present at or near the wafer surface during processing.

2. Apparatus according to claim 1, further comprising:
   means for receiving ion beam energy, said receiving means being located further away from said wafer surface than said sensing means and being used to provide said predetermined baseline.

3. Apparatus according to claim 2, wherein each of said sensing and said receiving means includes at least one optical lens.

4. Apparatus according to claim 1, wherein said baseline spectrum is a transient baseline spectrum.

5. Apparatus according to claim 2, wherein said baseline spectrum is a transient baseline spectrum.

6. Apparatus according to claim 1, wherein said comparing means compares said detected spectrum with a different baseline spectrum for each different ion beam species.

7. Apparatus according to claim 1, wherein said comparing means compares said detected spectrum with a different baseline spectrum for each different ion beam energy level.

8. Apparatus according to claim 1, wherein said comparing means compares said detected spectrum with a different baseline spectrum for each different ion beam current.

9. Apparatus according to claim 1, wherein said means for spectrally analyzing further includes an array of photodiodes for detecting an intensity of each wavelength component of said sensed energy.

10. Apparatus according to claim 1, wherein said means for spectrally analyzing includes an array of frequency filters for detecting an intensity of each frequency component of said sensed energy.

11. Apparatus according to claim 1, wherein said means for comparing subtracts said baseline spectrum from said detected spec&rum in real time, during implantation of a wafer.

12. Apparatus according to claim 11, further comprising:
    means for continuously updating a summed resultant spectrum which represents a sum of all resultant spectra obtained during a wafer implantation process; and,
    means for discontinuing the wafer implantation process if one or more components of said summed resultant spectrum exceeds a predetermined threshold.

13. Apparatus according to claim 12, wherein said discontinuing means includes a different predetermined threshold for each desired spectral component of said summed resultant spectrum.

14. Process for detecting particles present during ion beam implantation of a wafer comprising the steps of:
    sensing energy in a vicinity of the wafer surface;
    spectrally analyzing said sensed energy to provide a detected spectrum; and
    comparing said detected spectrum with a predetermined baseline spectrum representing characteristics of an ion beam used for wafer implantation, said comparison producing a resultant spectrum for identifying contaminants and residual gases present at or near the wafer surface during processing.

15. Process according to claim 14, further comprising the step of:
    receiving ion beam energy from a location outside said vicinity of said wafer surface to provide said predetermined baseline.

16. Process according to claim 14, wherein said baseline spectrum is produced experimentally by analyzing at least two wafer samples during implantation processes and determining common processing characteristics obtained during the implantation processes.

17. Process according to claim 15, wherein said baseline spectrum is produced experimentally by analyzing at least two wafer samples during implantation processes and determining common processing characteristics obtained during the implantation processes.

18. Process according to claim 14, wherein a different baseline spectrum is determined for each ion beam species.

19. Process according to claim 14, wherein said step of comparing includes subtracting said baseline spectrum from said detected spectrum in real time, during implantation of a wafer.

20. Process according to claim 19, further comprising the steps of:
    continuously updating a summed resultant spectrum which represents a sum of all resultant spectra obtained during a wafer implantation process; and,
    discontinuing the wafer implantation process if one or more components of said summed resultant spectrum exceeds a predetermined threshold.

21. Process according to claim 20, wherein a different predetermined threshold is experimentally determined for each desired spectral component of said summed resultant spectrum.

* * * * *